United States Patent [19]

Powell

[11] Patent Number: 4,583,049

[45] Date of Patent: Apr. 15, 1986

[54] FEED-FORWARD CIRCUIT

[75] Inventor: Jack Powell, Hermosa Beach, Calif.

[73] Assignee: TRW Inc., Redondo Beach, Calif.

[21] Appl. No.: 621,334

[22] Filed: Jun. 15, 1984

[51] Int. Cl.[4] .................................................. H03F 1/26
[52] U.S. Cl. ..................................... 330/151; 330/149; 330/286; 330/311
[58] Field of Search .............. 330/149, 151, 263, 311, 330/286, 287

[56] References Cited

U.S. PATENT DOCUMENTS

| | | | |
|---|---|---|---|
| 3,593,174 | 7/1971 | White ................................. | 330/286 |
| 3,649,927 | 3/1972 | Seidel ............................. | 330/151 X |
| 3,667,065 | 5/1972 | Beurrier et al. ................. | 330/151 X |
| 3,693,109 | 9/1972 | Swerdlow ........................ | 330/151 |
| 3,710,272 | 1/1973 | Ayaki ............................... | 330/286 |
| 3,886,470 | 5/1975 | O'Neil et al. ................... | 330/149 |
| 4,112,386 | 9/1978 | Everhart et al. ............... | 330/311 X |
| 4,130,807 | 12/1978 | Hall et al. ...................... | 330/151 X |
| 4,146,844 | 3/1979 | Quinn ............................. | 330/149 |
| 4,258,328 | 3/1981 | Prevot et al. ................... | 330/149 |
| 4,263,564 | 4/1981 | Lafon .............................. | 330/151 X |
| 4,320,353 | 3/1982 | Sasaki ............................. | 330/286 |
| 4,322,688 | 3/1982 | Schotzhauer et al. ......... | 330/151 X |
| 4,359,696 | 11/1982 | Gerard ........................... | 330/151 |
| 4,394,624 | 7/1983 | Bauman .......................... | 330/151 |
| 4,517,521 | 5/1985 | Preschutti et al. ............. | 330/151 X |

FOREIGN PATENT DOCUMENTS

| | | | |
|---|---|---|---|
| 2019104 | 10/1977 | Fed. Rep. of Germany ...... | 330/151 |
| 2069275 | 8/1981 | United Kingdom ............... | 330/151 |

Primary Examiner—Eugene R. LaRoche
Assistant Examiner—Steven J. Mottola
Attorney, Agent, or Firm—Noel F. Heal; Robert M. Wallace

[57] ABSTRACT

A feed-forward amplifier having delay lines formed as microstrip transmission lines, for reliability and low losses, and signal amplifiers that have phase linearity, to match the delay lines, and a relatively high gain. The resulting device can be manufactured more reliably at relatively low cost, but has improved error cancellation performance, improved temperature stability, and is simple to tune after assembly, without removal of components.

3 Claims, 11 Drawing Figures

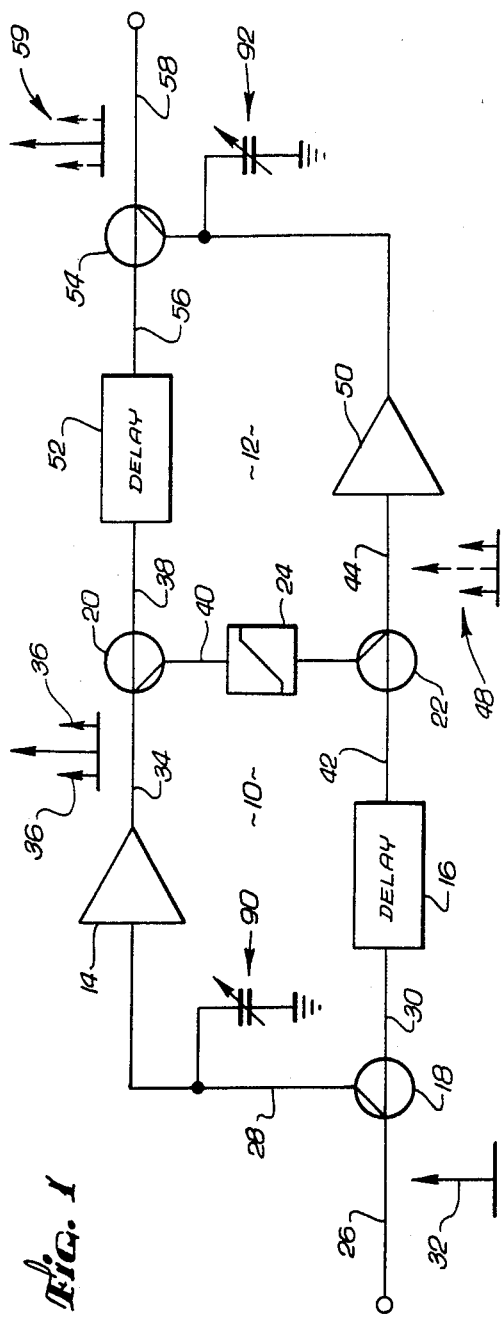
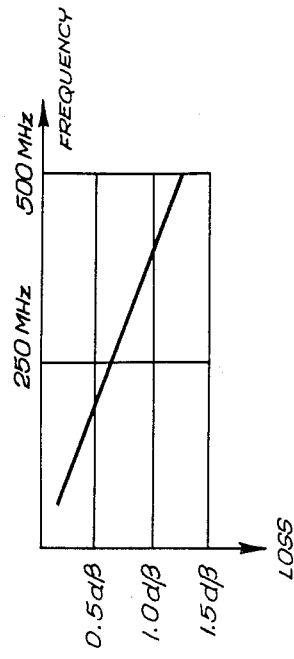
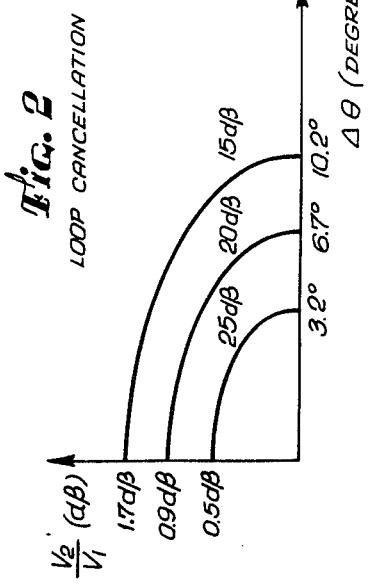

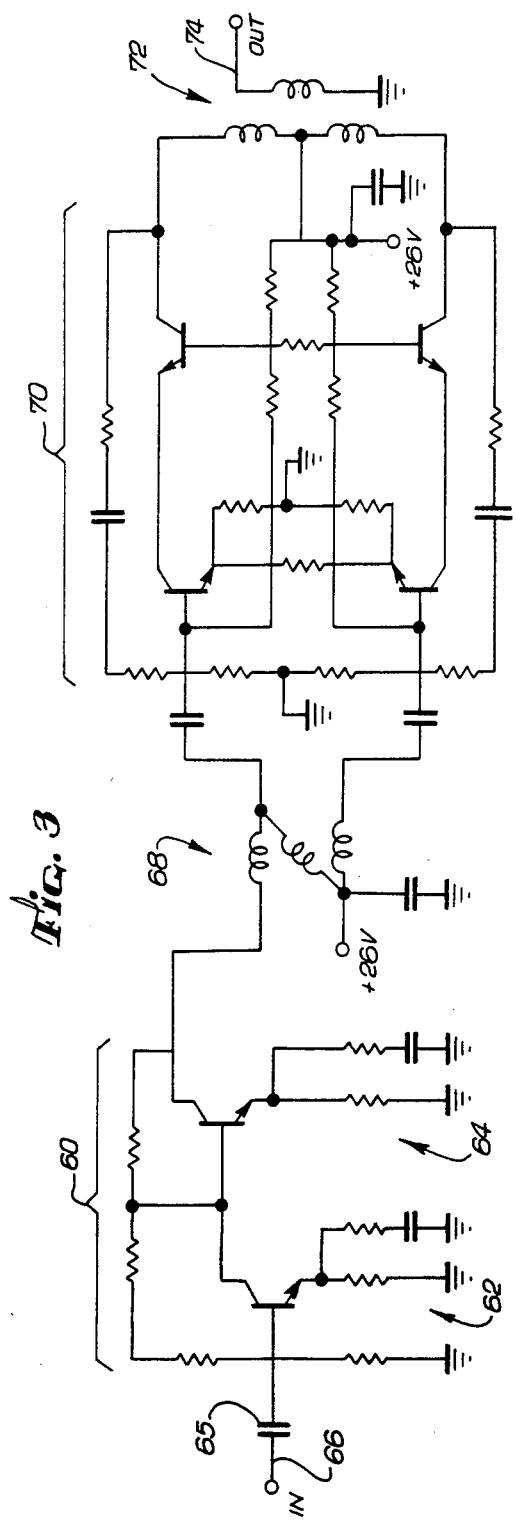
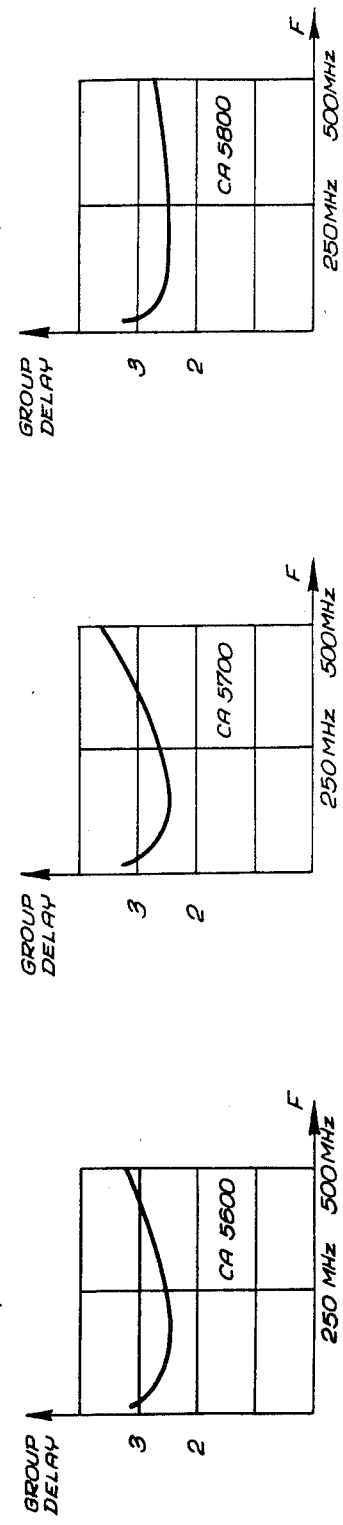

1

FEED-FORWARD CIRCUIT

CROSS-REFERENCE TO RELATED APPLICATION

This application is related to a concurrently filed application Ser. No. 621,333, filed June 15, 1984, by the same inventors; entitled "Amplifier Circuit Packaging Construction."

BACKGROUND OF THE INVENTION

This invention relates generally to feed-forward circuits, and more particularly, to feed-forward circuits used in the amplification of high-frequency signals in television applications. In recent years, cable television systems have been required to handle an increasing number of channels. Distortion and cross-modulation between the channels limits the number of amplifiers that can be cascaded and the maximum spacing between amplifiers.

A feed-forward technique is commonly used to reduce the distortion in individual amplifiers by a factor of at least one hundred, over relatively wide bandwidths. The basic technique involves the use of two cancellation loops. In a signal cancellation loop, the distorted signal from a main amplifier is subtractively combined with a delayed form of the original signal, to produce a signal containing substantially only error components. In the second cancellation loop, the error signal derived from the signal cancellation loop is further amplified, and fed forward to be subtractively combined with the output of the main amplifier. The error components cancel and a distortion-free signal remains.

While the theory of feed-forward error cancellation is relatively simple and well known, it is not a simple matter to construct a practical device in which amplitudes and phase angles are controlled to the required degree of accuracy. To achieve cancellation of the error signals by a factor of 25 decibels (dB), the amplitudes have to be matched to within 0.5 dB and the phase angles matched to within 3.2°.

In the past, feed-forward amplifiers for this purpose have included separate amplifiers, and delay lines made from discrete inductances and capacitances. These discrete-component delay lines cannot be reliably reproduced, and are costly to assemble. The amplifiers used in the past have been hybrid designs, with the delay lines being plug-in components. The relatively large number of variable components in this combination resulted in a tuning procedure that was considerably flexible, but also very sensitive.

The standard amplifier modules had nonlinear phase characteristics, which had to be matched by some form of adjustable phase equalization made up of LC (inductor-capacitor) low-pass filters. One attempt at designing a linear phase amplifier was described by R. G. Meyer et al., "A Wide-band Feed-forward Amplifier," IEEE Journal of Solid State Circuits, Vol. SC-9, No. 6, December 1974. However, this single-ended design would not meet the necessary performance requirements.

Discrete designs of the past have required considerable space and were difficult to isolate from surrounding circuitry. Amplifiers of this type are consequently costly, inconvenient to manufacture and tune, and have poor temperature stability. It will therefore be appreciated that there is a real need for a low-cost feed-forward amplifier that can be manufactured and tuned reliably and conveniently, and that has good performance characteristics, including temperature stability. The present invention is directed to these ends.

SUMMARY OF THE INVENTION

The present invention resides in a low-cost feed-forward amplifier that may be reproducibly manufactured, is simple to tune, has good cancellation performance, and good temperature stability. Briefly, and in general terms, the amplifier of the invention includes the same circuit components as a conventional feed-forward amplifier, namely a signal cancellation loop and an error cancellation loop. The signal cancellation loop includes a main amplifier to which an input signal is applied, to obtain an amplified but distorted output signal, a first coupler for coupling a portion of the output signal from the main amplifier, a first delay line to which the input signal is also applied, to delay the signal by substantially the same amount as the main amplifier, equalization means, to make amplitude and phase adjustments in the main amplifier output signal, to match it with the output signal from the first delay line, and a second coupler, to subtract the delay line output signal from the equalizer means output signal, effectively cancelling the input signal component and leaving only error signal components.

The error signal cancellation loop includes an error signal amplifier connected to receive an error signal from the second coupler, a second delay line connected to delay the distorted output signal from the main amplifier by substantially the same amount as the error amplifier, and a third coupler, connected to subtract the output of the error signal amplifier from the output of the second delay line, cancelling error signal components in the distorted output signal.

Two key features of the invention that distinguish it from other feed-forward amplifiers are that the first and second delay lines take the form of printed microstrip lines, and the main and error signal amplifiers have a high gain and a relatively linear phase-frequency characteristic. The microstrip delay lines have easily reproducible characteristics and have low losses because of their low dc resistance. They are also much smaller than discrete delay lines, and therefore have less associated radiation. Moreover, their temperature stability is an order of magnitude better than that of discrete delay lines.

The main and error signal amplifiers are preferably made to include a single-ended section with two common emitter stages, and a standard cascode push-pull stage. In the illustrated embodiment, the amplifiers have a minimum gain of approximately 39 dB at 450 MHz and a roll-off frequency of at least 500 MHz.

The circuit of the invention includes two high-impedance test ports through which loop cancellation measurements are made. In accordance with one aspect of the invention, loop cancellation measurements can be made without removal of components, relying instead on isolation provided by the couplers. The accuracy of the loop cancellation measurements is enhanced by the use of higher gains in the main and error signal amplifiers, even though the feed-forward gain of the circuit is maintained constant.

In a related aspect of the invention, amplitude adjustment of the entire amplifier device is effected by first recording amplifier gains before assembly, then selecting appropriate equalizer parameters during assembly.

Final phase adjustments are made by means of two trimmer capacitors located in the circuits of the first and fourth couplers. Specifically, one trimmer capacitor is located in the input to the main amplifier, and the other is located in the output from the error signal amplifier.

It will be appreciated from the foregoing that the present invention represents a significant advance in the field of feed-forward amplifiers for high-frequency signals. In particular, the invention provides a low-cost device with good cancellation characteristics, using microstrip delay lines and matching linear, high-gain amplifiers. The device is well suited for fabrication in large quantities with reproducible characteristics, and is conveniently tunable without removal of components. Other aspects and advantages of the invention will become apparent from the following more detailed description, taken in conjunction with the accompanying drawings.

BRIEF DESCRIPTION OF THE DRAWINGS

FIG. 1 is a block diagram of a feed-forward amplifier in accordance with the present invention;

FIG. 2 is a gain-versus-phase-angle graph showing the requirements for gain and phase-angle match for effective cancellation in a feed-forward amplifier;

FIG. 3 is a schematic diagram of an amplifier module used in the feed-forward amplifier of the present invention;

FIG. 4 is a loss-versus-frequency graph for a delay line used in the amplifier of the invention;

FIGS. 5a–5c are comparative graphs showing time delay as a function of frequency, for a standard 34 dB amplifier module, a standard 38 dB amplifier module, and a 38 dB amplifier module constructed in accordance with the invention;

DESCRIPTION OF THE PREFERRED EMBODIMENT

Figure 6B:
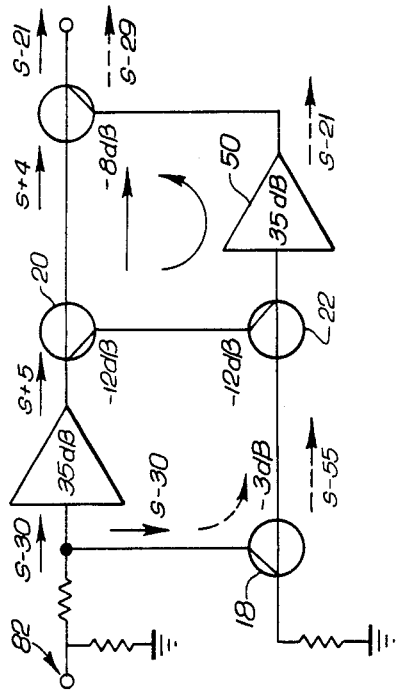
FIGS. 6a and 6b are simplified schematic diagrams of a feed-forward amplifier showing loop cancellation measurements for assumed typical circuit parameters.

As shown in the drawings for purposes of illustration, the present invention is concerned with high-frequency feed-forward amplifiers. These devices are widely used in analog cable communications systems, such as cable television systems. Although feed-forward amplifiers have been used for this purpose for some time, it has not been possible to manufacture them with uniform characteristics in high volume and at low cost.

The principle of the feed-forward amplifier can be readily explained with reference to FIG. 1. The basic amplifier circuit comprises a signal cancellation loop, indicated generally by reference numeral 10, and an error cancellation loop 12. The signal cancellation loop 10 includes a main amplifier 14, a delay line 16, first, second and third directional couplers 18, 20 and 22, and an equalizer circuit 24. An input signal to be amplified is input on line 26 to the first coupler 18, which couples energy to two output lines 28 and 30. Line 30 is connected to the delay line 16 and line 28 is connected as an input to the main amplifier 14. The input signal on line 26 is represented as a single frequency tone, as indicated at 32. After amplification in the main amplifier 14, the signal on output line 34 from the amplifier contains distortion or error signal components, as indicated at 36 by additional smaller frequency tones.

The output signal on line 34 is split by the second coupler 20, and is output along lines 38 and 40. Line 40 passes through the equalization circuit 24 and thence to the third coupler 22. The other input to the third coupler 22 is provided over an output line 42 from the delay line 16. The third coupler 22 functions to subtract one input signal from the other and to produce a difference signal on line 44.

The signal from the delay line 16, on line 42, contains only the original input signal, delayed in the delay line by an amount equivalent to the delay interjected by the main amplifier 14. The signal on line 40 to the third coupler 22 contains both the original signal and the error components. If the phase and amplitude of the original signal components applied to the third coupler 22 are exactly matched, they will cancel in the third coupler 22, leaving an output signal on line 44 that contains only error signal components. This is indicated diagramatically at 48, where the original signal tone is shown as a broken line.

The function of the equalizer circuit 24 is to perform matching of the signals on lines 40 and 42. Since there are amplitude losses, or negative gain, in the couplers, only slight amplitude correction is typically needed in the equalization circuit 24. But some "slope" correction may be needed to compensate for variations in amplifier gain over a frequency range of interest.

The error cancellation loop comprises an error amplifier 50, another delay line 52, and a fourth directional coupler 54. The error signal components output from the third coupler 22 on line 44 are amplified in the error amplifier 50 and fed forward to the fourth coupler 54. The distorted signal from the main amplifier 14 is fed through the second coupler 20 and over line 38 to the second delay line 52. The output of this delay line is connected over line 56 as another input to the fourth coupler 54. In this manner, the fed-forward error signal components from the error amplifier 50 are combined subtractively in the fourth coupler 54 with the distorted signal from the main amplifier 14. The second delay line 52 assures an appropriate phase match between the error signals from the two inputs, and the equalizer circuit 24 performs amplitude matching for the error cancellation loop 12 as well as for the signal cancellation loop 10. Accordingly, the output from the fourth coupler 54, on line 58, is an amplified form of the original input signal on line 26, with error components removed as indicated diagrammatically at 59.

Although the theory of operation of feed-forward amplifiers of this type is well known, and amplifier distortion can be reduced by a factor of a hundred or more, no-one prior to this invention has produced a low-cost, and reliably reproducible feed-forward amplifier. FIG. 2 shows diagrammatically that, in order to achieve signal cancellation of 25 dB, the signal amplitudes must be matched to within 0.5 dB and signal phases must be matched to within 3.2°. The ideal feed-forward amplifier must not only meet these requirements, but must also provide a convenient technique for tuning the circuitry as simply as possible.

In accordance with the invention, a feed-forward amplifier of the type described has its delay lines 16 and 52 made in the form of microstrip transmission lines, and the amplifiers 14 and 50 are configured to provide high gain and a relatively linear phase-frequency characteristic to match the characteristics of the delay lines.

The microstrip delay lines 16 and 52 have a low loss figure, as indicated in FIG. 5. Specifically, the losses are shown for a 2.8 ns (nanosecond) delay line range up to approximately 1.2 dB at 500 MHz. Each microstrip delay line follows a serpentine path to provide the appropriate time delay, and is fabricated using printed circuit techniques. More specifically, the microstrip is formed by first sputtering two layers: Cermet for adhesion purposes, followed by gold for conductivity. These are followed by a relatively thick layer (500 microinches) of plated copper and a 150-microinches layer of plated gold.

FIG. 3 shows an exemplary amplifier module used as the main amplifier 14 and the error amplifier 50. The module includes a front-end section 60 having two single-ended common-emitter stages 62 and 64, the first of which receives an input signal through a coupling capacitor 65 and over line 66. The circuit further includes a coupling transformer 68, and a conventional cascode push-pull output stage 70, with an output transformer 72 providing output on line 74.

This combination of amplifier stages results in a characteristic that matches very well with the microstrip delay lines 16 and 52. The gain is preferably 38 or 39 dB at 450 MHz, and the roll-off frequency is at least as high as 500 MHz. As will be discussed further below, this relatively high gain facilitates measurement of loop cancellation in the amplifier of the invention.

FIGS. 5a–5c compare the phase linearity of the amplifier used in the device of the invention (FIG. 5c) with similar characteristics for a standard 34 dB amplifier module (FIG. 5a) and a standard 38 dB amplifier module (FIG. 5b). It will be observed that the amplifier module used in the invention has a relatively flat phase or delay characteristic up to at least 500 MHz.

Additional aspects of the invention relate to tuning and loop cancellation measurements. Prior to the invention, the measurement of signal cancellation in either of the cancellation loops was made by physically removing the delay lines and adding external loads for testing and calibration. When measuring the cancellation of the signal cancellation circuit 10, the second delay line 52 would be removed, and when testing the error signal cancellation the first delay line 14 would be removed. Since the circuit of the invention is integrated in nature, removal of the delay lines is impractical, and some other technique had to be developed for measurement of loop cancellation and for making appropriate tuning adjustments.

The cancellation measurement approach used makes use of the inherent isolation provided by the directional couplers. Each of the couplers 18, 20, 22 and 54 couples energy either from one input port to two output ports or from two input ports to one output port. However, coupler isolation prevents coupling between the two input ports or the two output ports. Typically, when expressed as a gain this isolation has a value of about −25 dB.

Figure 6D:
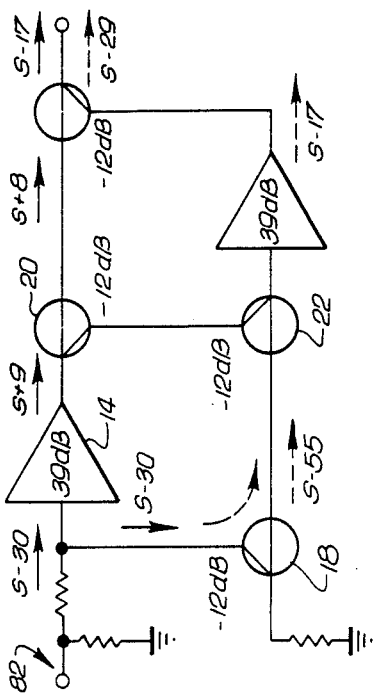
FIGS. 6c and 6d are schematic diagrams similar to FIGS. 6a and 6b, but with a higher gain amplifier module.
Figure 6A:
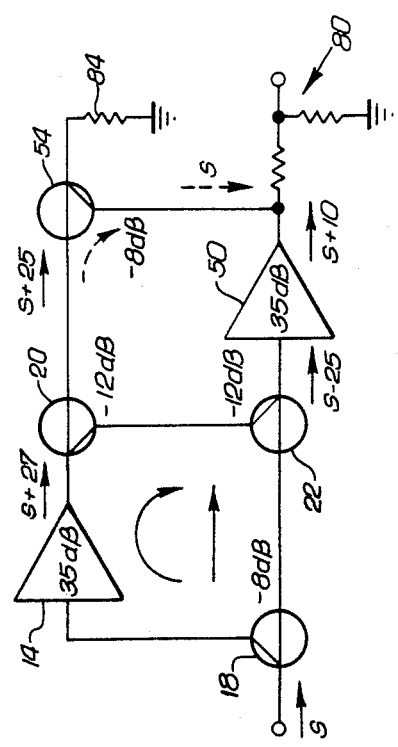
Figure 6C:
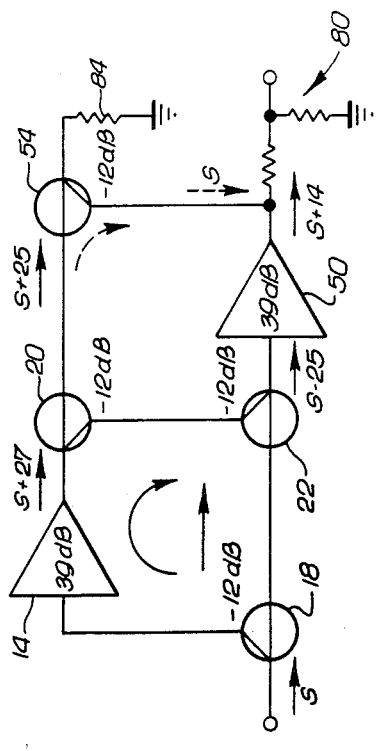

In accordance with one aspect of the invention, then, loop cancellation measurements are made only with the aid of two high-impedance test ports, indicated at 80 in FIGS. 6a and 6c and 82 in FIGS. 6b and 6d. In accordance with a related aspect of the invention, the gain of the main amplifier 14 and error amplifier 50 is made relatively high, and the effect of any lack of coupler isolation is considerably reduced.

FIG. 6a shows the technique employed for measurement of loop cancellation in the main signal cancellation loop. The schematic form of FIGS. 6a–6d, is the same as that of FIG. 1, except that the delay lines 16 and 52 have been omitted for simplicity. The delay lines are not physically removed for these measurements, however. Test port 80 provides a connection to the output of the error amplifier 50, and the output of the fourth coupler 54 is externally connected to load impedance 84.

Cancellation in the main cancellation loop can be measured by injecting an input signal on input line 26 and measuring the output at test port 80. Theoretically, there should be complete signal cancellation at the third coupler 22, but in practice a cancellation factor of about −25 dB is obtained. If the error cancellation loop cannot be disconnected, such as by removal of the delay line in that loop, the accuracy of the measurement at test port 80 is affected by a signal coupled between input ports of the fourth coupler 54, as indicated by the arrows shown in broken lines. An estimate of this effect can be made if various circuit parameters are known or assumed. In the figures, it is assumed that the feed-forward gain is 24 dB, that the coupler isolation is −25 dB, and that the loop cancellation factor is −25 dB.

In FIG. 6a, the gain of the main and error amplifiers is 35 dB, and a signal of strength s is injected on the input line 26. The input signal is cancelled or reduced to s−25 in coupler 22, then amplified by 35 dB to s+10 at the test port 80. Couplers 18 and 54 are assumed to inject an 8 dB loss, so that the signal input to the main amplifier 14 is s−8, and the signal output from the main amplifier is s−8+35, or s+27. There is assumed to be an additional 2 dB loss in the second coupler 20 and the second delay line 16 (FIG. 1), so that s+25 is applied to the fourth coupler 54. Since there is a −25 dB coupler isolation, the signal strength reaching the test port 80 by this route is s. Therefore, there is a 10 dB difference between the signal being measured (s+10) at the test port 80 and the spurious signals transmitted in a reverse direction around the error cancellation loop.

FIG. 6b shows a similar calculation in relation to measurement of error loop cancellation. In this configuration, an error signal, indicated as s−30, is injected through the other test port 82 and into the main amplifier 14. After amplification, the error signal is at a level s+5; then a 1 dB loss is assumed before reaching the fourth coupler 54, which is assumed to provide a 25 dB cancellation, leaving an output signal of s−21. Reverse signal flow in the main signal cancellation loop gives a spurious signal s−55 into the error amplifier 50, and an amplified output of s−21. Finally, an 8 dB loss in the fourth coupler 54 results in a spurious output of s−29, or 8 dB below the signal being measured (s−21) at the output of the fourth coupler 54.

FIGS. 6c and 6d show the effect of increasing the gain of each amplifier 14 and 50 to 39 dB, while degrading the first and fourth couplers 18 and 54 from 8 dB to 12 dB, thereby keeping the feed-forward gain the same as in FIGS. 6a and 6b. For the main signal cancellation loop, the spurious signal is now 14 dB below the signal being measured at the test port 80, and for the error cancellation loop the spurious signal is 12 dB below the signal being measured at the output of the fourth coupler 54. Accordingly, the use of higher gains in the amplifiers 14 and 50 results in improved accuracy in the measurement of loop cancellation.

In accordance with another aspect of the invention, amplitude adjustment is made by simply recording the gains of the main and error amplifiers 14 and 50 prior to assembly of the device; then selecting appropriate equalizer components during assembly. Phase adjustments are made by means of two trimmer capacitors 90 and 92. Trimmer capacitor 90 is located on the input line 28 of the main amplifier 14 and makes phase adjustments in the main signal cancellation loop 10. Capacitor 92 is located on the output line 56 from the error amplifier 50, and makes phase adjustments in the error cancellation loop 12.

It will be appreciated from the foregoing that the present invention represents a significant advance in the field of high-frequency feed-forward amplifiers. In particular, the invention provides a low-cost device with good cancellation characteristics, using microstrip delay lines and matching linear, high-gain amplifiers, and is well suited for fabrication with easily reproducible characteristics. Furthermore, the device is conveniently tunable and loop cancellation measurements are easily made, both without removal of components. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A feed-forward amplifier, comprising:
   a signal cancellation loop including
      a main amplifier to which an input signal is applied, to obtain an amplified but distorted output signal,
      a first coupler for coupling a portion of the output signal from the main amplifier,
      a first delay line to which the input signal is also applied, to delay the signal by substantially the same amount as the main amplifier,
      equalization means, to make amplitude and phase adjustments in the main amplifier output signal, to match it with the output signal from the first delay line, and
      a second coupler, to subtract the delay line output signal from the equalizer means output signal, to effectively cancel the input signal component and leave only error signal components;
   an error signal loop including
      an error signal amplifier connected to receive an error signal from the second coupler,
      a second delay line connected to delay the distorted output signal from the main amplifier by substantially the same amount as the error amplifier, and
      a third coupler, connected to subtract the output of the error amplifier from the output of the second delay line, to cancel error signal components in the distorted output signal;
   wherein
      the first and second delay lines are microstrip lines, and
      the main and error amplifiers have a high gain and a relatively linear phase-frequency characteristic;
   and wherein
      the main amplifier and the error amplifier each include a single-ended first section having two common-emitter stages, and an output stage of cascode push-pull configuration.

2. A feed-forward amplifier as set forth in claim 1, and further including:
   phase adjustment means in each of the cancellation loops, located to avoid any influence on input and output impedance matching.

3. A feed-forward amplifier as set forth in claim 2, wherein:
   the phase adjustment means includes two trimmer capacitors, one located between the first coupler and the main amplifier, and the other located between the error amplifier and the fourth coupler.

* * * * *